United States Patent
Hu et al.

(10) Patent No.: US 9,947,665 B2
(45) Date of Patent: Apr. 17, 2018

(54) SEMICONDUCTOR STRUCTURE HAVING DIELECTRIC LAYER AND CONDUCTIVE STRIP

(71) Applicant: Macronix International Co., Ltd., Hsinchu (TW)

(72) Inventors: Chih-Wei Hu, Miaoli County (TW); Teng-Hao Yeh, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 97 days.

(21) Appl. No.: 14/331,303

(22) Filed: Jul. 15, 2014

(65) Prior Publication Data
US 2016/0020167 A1    Jan. 21, 2016

(51) Int. Cl.
| H01L 27/10 | (2006.01) |
| H01L 27/115 | (2017.01) |
| H01L 27/11582 | (2017.01) |
| H01L 27/11565 | (2017.01) |
| H01L 27/1157 | (2017.01) |

(52) U.S. Cl.
CPC ........ *H01L 27/101* (2013.01); *H01L 27/1157* (2013.01); *H01L 27/11565* (2013.01); *H01L 27/11582* (2013.01)

(58) Field of Classification Search
CPC ............. H01L 23/528; H01L 23/53295; H01L 27/11582; H01L 27/11556; H01L 27/101
USPC .......................................................... 438/396
See application file for complete search history.

(56) References Cited

U.S. PATENT DOCUMENTS

| 5,736,771 A * | 4/1998 | Huang | H01L 27/112 257/390 |
| 6,153,463 A * | 11/2000 | Wei | H01L 28/40 438/253 |
| 2012/0007167 A1* | 1/2012 | Hung | H01L 27/0688 257/324 |
| 2013/0003434 A1* | 1/2013 | Lue | H01L 29/792 365/51 |
| 2013/0037860 A1* | 2/2013 | Jang | H01L 27/11519 257/211 |
| 2013/0214413 A1* | 8/2013 | Lee | H01L 21/0337 257/741 |

FOREIGN PATENT DOCUMENTS

TW    201232705 A1    8/2012

\* cited by examiner

*Primary Examiner* — Daniel Luke
(74) *Attorney, Agent, or Firm* — McClure, Qualey & Rodack, LLP (57) ABSTRACT

A semiconductor structure is provided. The semiconductor structure includes a conductive strip, a conductive layer, a first dielectric layer, and a second dielectric layer. The first dielectric layer is between the conductive strip and the conductive layer arranged in a crisscross manner. The second dielectric layer is different from the first dielectric layer. The second dielectric layer and the first dielectric layer are adjoined with the conductive strip in different positions on the same sidewall of the conductive strip.

17 Claims, 13 Drawing Sheets

SEMICONDUCTOR STRUCTURE HAVING DIELECTRIC LAYER AND CONDUCTIVE STRIP

BACKGROUND

Technical Field

The disclosure relates in general to a semiconductor structure, and particularly to a memory.

Description of the Related Art

In recent years, the structures of semiconductor devices have been changed constantly, and the storage capacity of the devices has been increased continuously. Memory devices are used in storage elements for many products such as MP3 players, digital cameras, computer files, etc. As the application increases, the demand for the memory device focuses on small size and large memory capacity. For satisfying the requirement, a memory device having a high element density and a small size and the manufacturing method thereof is in need.

As such, it is desirable to develop a three-dimensional (3D) memory device with larger number of multiple stacked planes to achieve greater storage capacity, a small size, and yet having excellent property and stability.

SUMMARY

According to an embodiment of the present disclosure, a semiconductor structure is provided. The semiconductor structure comprises a conductive strip, a conductive layer, a first dielectric layer, and a second dielectric layer. The first dielectric layer is between the conductive strip and the conductive layer arranged in a crisscross manner. The second dielectric layer is different from the first dielectric layer. The second dielectric layer and the first dielectric layer are adjoined with the conductive strip in different positions on the same sidewall of the conductive strip.

According to another embodiment of the present disclosure, a semiconductor structure is provided. The semiconductor structure comprises a conductive layer, a first dielectric layer and a conductive strip separated from the conductive layer crisscrossing the conductive strip by the first dielectric layer. The conductive strip comprises a first conductive portion, a second conductive portion, and a curved surface between the first conductive portion and the second conductive portion.

According to yet another embodiment of the present disclosure, a semiconductor structure is provided. The semiconductor structure comprises a conductive layer, a conductive strip and a first dielectric layer. The conductive layer has a first sidewall, a second sidewall opposing to the first sidewall, and a third sidewall between the first sidewall and the second sidewall. The first dielectric layer separates the conductive strip and the conductive layer crisscross the conductive strip. A thickness of a portion of the first dielectric layer on the first sidewall and the second sidewall of the conductive layer is thicker than a thickness of a portion of the first dielectric layer on the third sidewall of the conductive layer.

The above and other embodiments of the disclosure will become better understood with regard to the following detailed description of the non-limiting embodiment(s). The following description is made with reference to the accompanying drawings.

BRIEF DESCRIPTION OF THE DRAWINGS

FIG. 1A to FIG. 11A illustrate a process for manufacturing a semiconductor structure according to one embodiment.

DETAILED DESCRIPTION

FIG. 1A to FIG. 11A illustrate a process for manufacturing a semiconductor structure according to one embodiment.

Figure 1A:
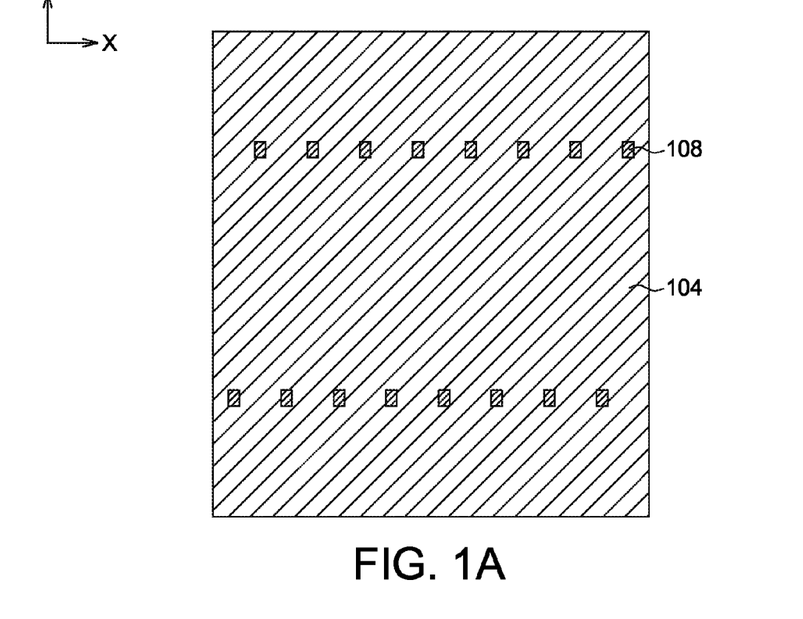
Figure 1B:
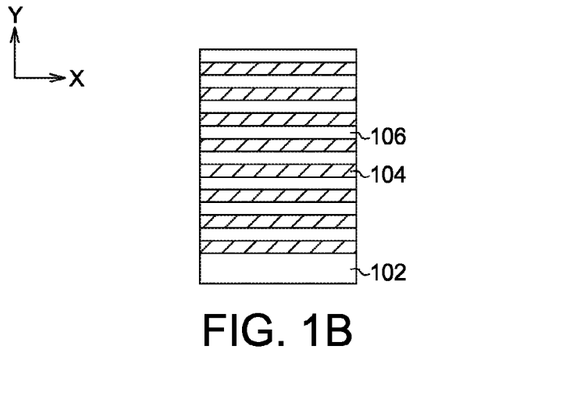

Referring to FIG. 1A and FIG. 1B, showing a top view and a cross-section view of a stack structure respectively, the stack structure comprises conductive films 104 and dielectric films 106 crisscross stacked on a bottom insulating layer 102. In embodiments, the top layer of the stack structure is one of the dielectric films 106. For the sake of brevity and easy understanding, an area where the stack structure is located is indicated by the conductive films 104 (the dielectric film 106 of a top level over an upper surface of the conductive film 104 of a top level is not shown) in the top views of FIGS. 1A and 2A, and the concept is not described repeatedly in the following.

The bottom insulating layer 102 may be formed on a semiconductor substrate (not shown). The semiconductor substrate may comprise a silicon, a SOI, or other suitable materials for substrate. In one embodiment, the bottom insulating layer 102 and the dielectric films 106 are an oxide such as silicon oxide. However, the present disclosure is not limited thereto. In other embodiments, the bottom insulating layer 102 and the dielectric films 106 may comprise an oxide, a nitride or an oxynitride, such as silicon oxide, silicon nitride, silicon oxynitride, or other suitable dielectric materials, of a single-layer structure or a multi-layer structure, respectively. The conductive films 104 may comprise polysilicon or other suitable conductive materials.

Referring to FIG. 1A, source contact plugs 108 are formed in the stack structure to electrically connected to conductive films 104 of different levels. The source contact plug 108 may be formed by a method comprising forming a through hole in the stack structure by an etching process, and filling the through hole by a conductive material such as polysilicon or a metal.

Figure 2A:
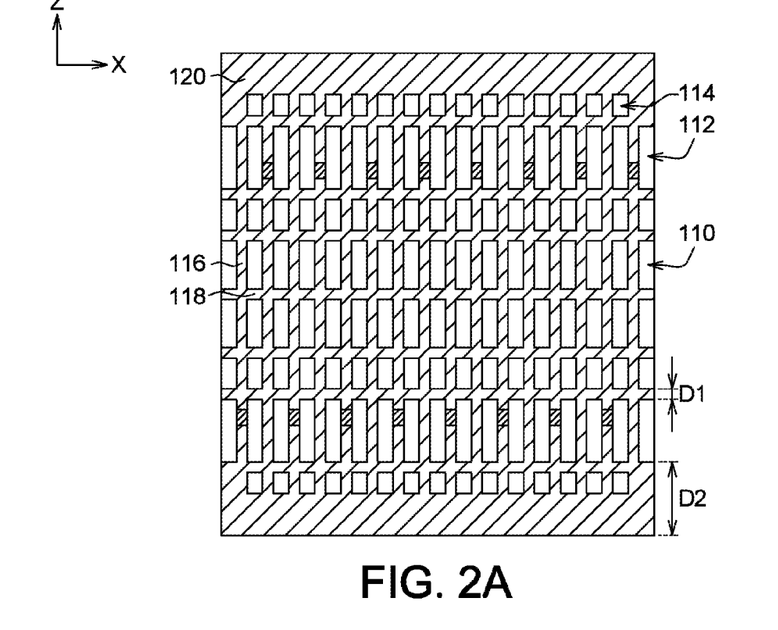
Figure 2B:
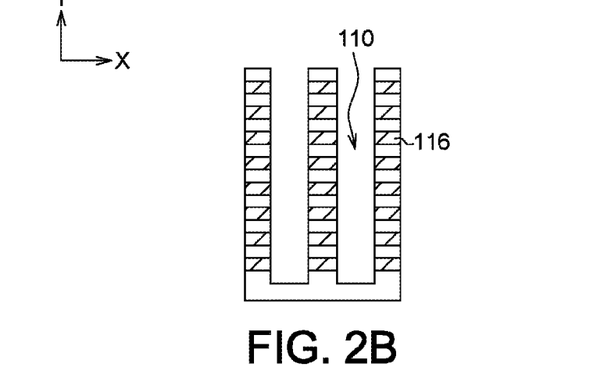

Referring to FIG. 2A and FIG. 2B, The stack structure is patterned by forming a first through hole 110, a through hole 112 and a through hole 114 in the tack structure. The patterned stack structure has strip stacks (comprising conductive strips 116) continuously extending in Z direction and separated from each other, and connection stacks (comprising conductive connection 118) extending in X direction and adjoined between the strip stacks (or conductive strips 116). The strip stack (conductive strip 116) may be adjoined with a plate stack (comprising a conductive plate 120). In one embodiment, for example, a dimension D1 of the connection stack (or the conductive connection 118) in Z direction is 0.05 μm. A dimension D2 of the plate stack (or the conductive plate 120) is 0.5 μm.

Figure 3A:
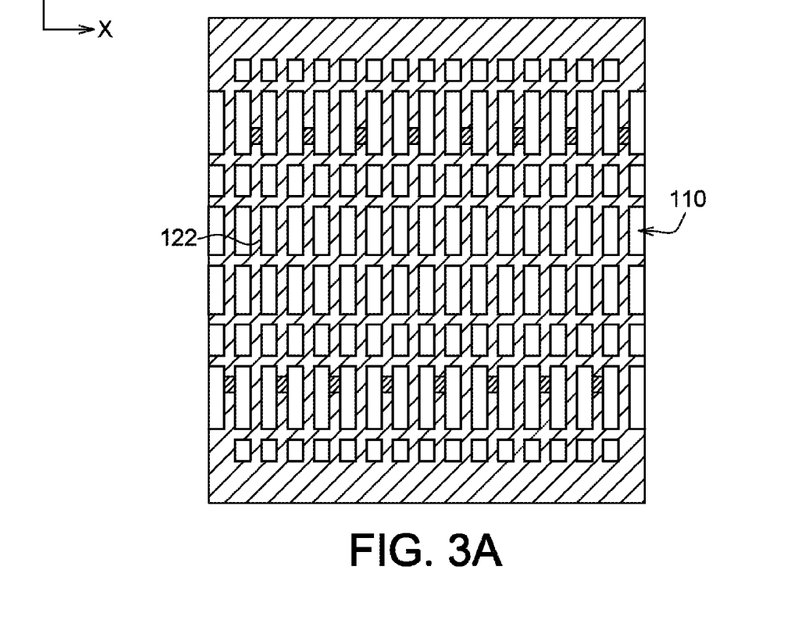
Figure 3B:
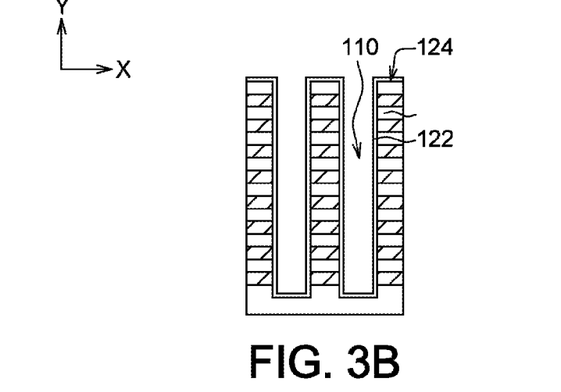
Figure 3C:
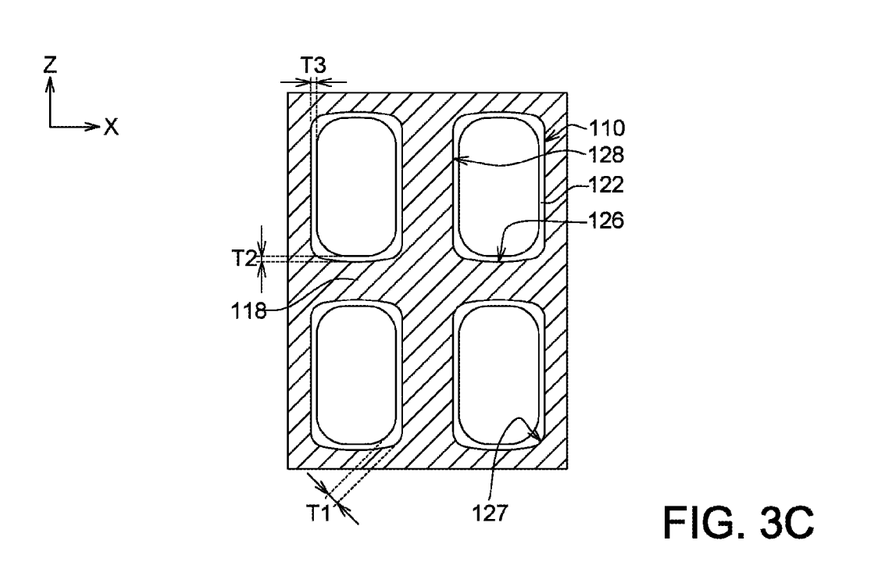

Referring to FIG. 3A to FIG. 3C, a first dielectric layer 122 may be formed on the stack structure exposed by the first through hole 110 and on a upper surface 124 of the stack structure. The first dielectric layer 122 may comprise an ONO structure, an ONONO structure, an ONONONO structure, or a multi-layer structure of tunneling material/trapping material/blocking material, for NAND storage material. For the sake of brevity and easy understanding, the dielectric film 106 of the top level and a portion of the first dielectric layer 122 over the upper surface 124 are not shown in the top view of FIGS. 3A and 3C, the first dielectric layer 122 in FIG. 3A and FIG. 3C are shown by a portion in the first through hole 110. Referring to FIG. 3C, an enlarged view of a region near four the first through holes 110 is shown. In embodiments, the first through hole 110 is formed by an etching process with a lithograph technique. The first through hole 110 of bar shape extending in Z direction has a curved surface 127 at a corner between a shorter sidewall 126 and a longer sidewall 128 of the first through hole 110. The profile of the first through hole 110 results in the first dielectric layer 122 having a thickness T1 on the curved surface 127 bigger than a thickness T2 and a thickness T3 respectively on the shorter sidewall 126 and the longer sidewall 128 of the first through hole 110 due to different depositing rates. The thickness T2 and the thickness T3 of the first dielectric layer 122 may be identical substantially.

Figure 4A:
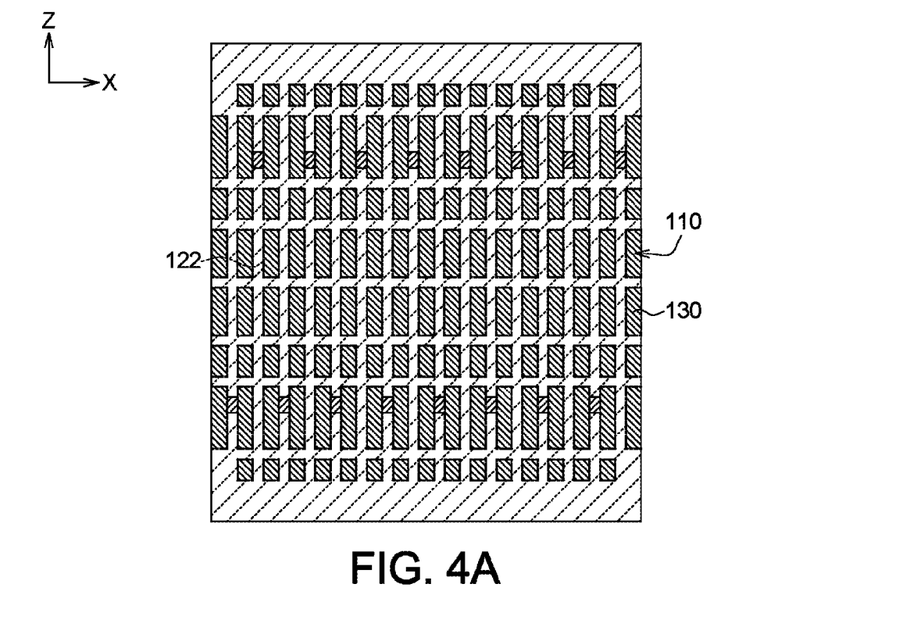
Figure 4B:
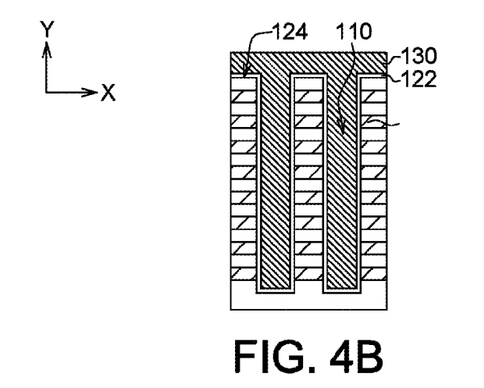
Figure 4C:
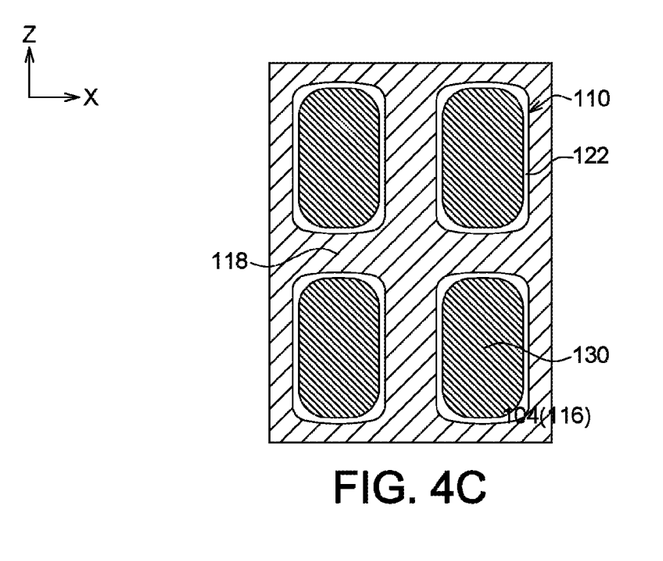

Referring to FIG. 4A to FIG. 4C, a conductive layer 130 is filled into the first through hole 110, and formed on the first dielectric layer 122 on the upper surface 124 of the stack structure. The conductive layer 130 may comprise polysilicon or other suitable materials. For the sake of brevity and easy understanding, in FIG. 4A, a portion of the conductive layer 130 filling into the first through hole 110 and overlapping the first through hole 110 is shown with solid lines same with those for the conductive layer 130 shown in FIG. 4B, and an another portion of the conductive layer 130 covering the upper surface 124 is shown with dashed lines. The dashed lines may also indicate the conductive film 104 is covered by the conductive layer 130. In FIG. 4C, the elements over the conductive film 104 of the top level are not shown.

Figure 5A:
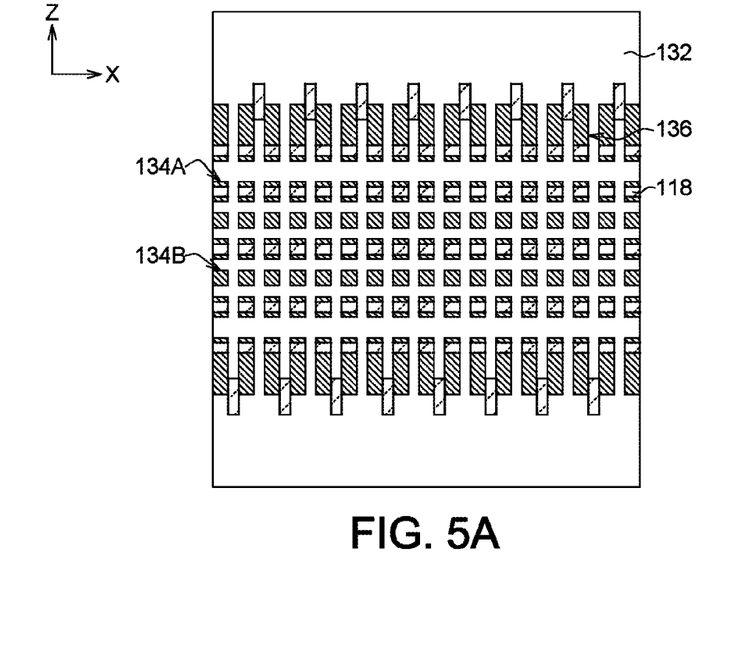
Figure 5B:
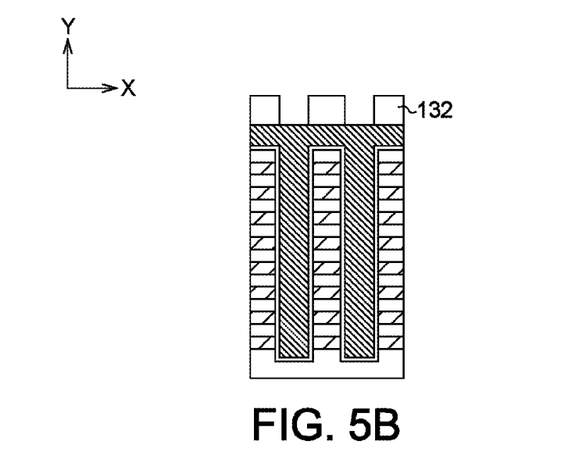

Referring to FIG. 5A to FIG. 5B, a patterned mask layer 132 such as a photo resist is formed on the conductive layer 130.

Figure 6A:
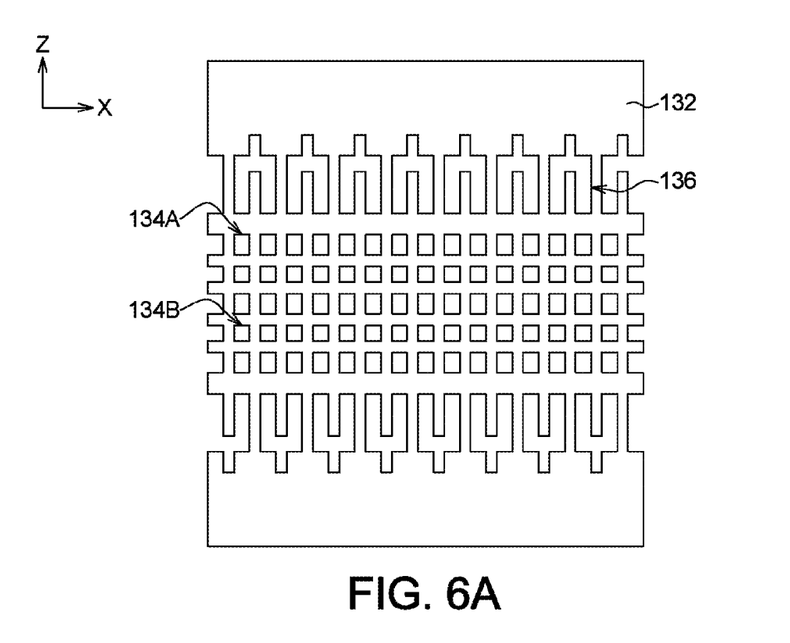
Figure 6B:
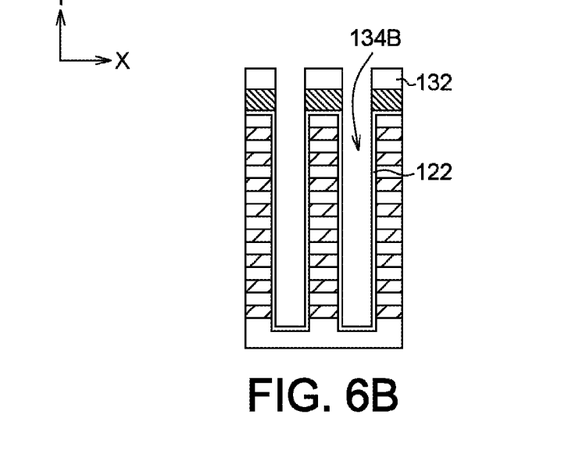

Referring to FIG. 6A and FIG. 6B, second through holes 134A, 134B and a fork through hole 136 of the mask layer 132 are transferred down into the conductive layer 130, the first dielectric layer 122 and the stack structure. In one embodiment, an etching process having a low etching selectivity ratio to materials of the conductive layer 130, the first dielectric layer 122 and the stack structure (comprising the conductive films 104 and the dielectric films 106 shown in (FIG. 1B) is chosen to perform the transferring step.

Figure 7A:
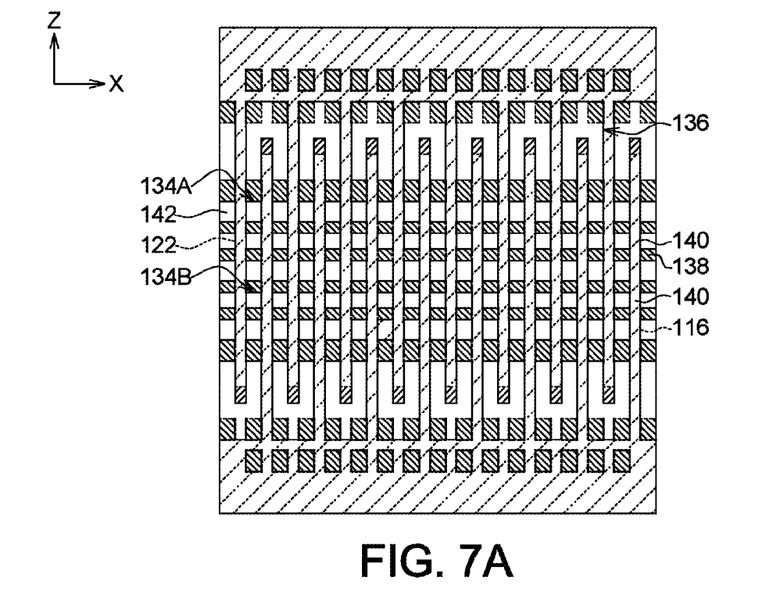
Figure 7B:
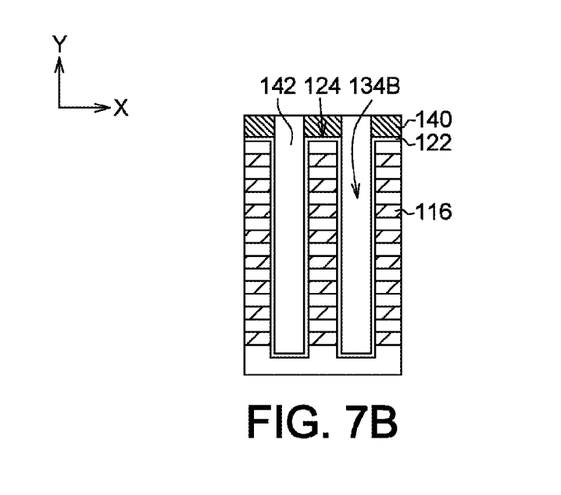
Figure 7C:
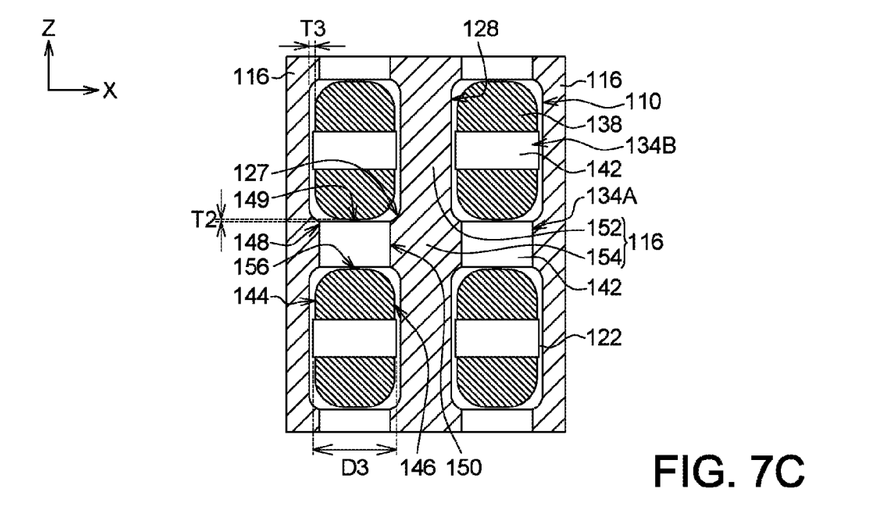

Referring to FIG. 7A to FIG. 7C, after the mask layer 132 (FIG. 6A and FIG. 6B) is removed, the remained portions of the conductive layer 130 comprises conductive layers 138 separated from each other and extending in Z direction, and strip portions 140 adjoined between the conductive layers 138. The strip portion 140 overlaps with the strip stack (conductive strip 116) under the strip portion 140. For the sake of brevity, the elements over the conductive film 104 of the top level are not shown in FIG. 7C.

A second dielectric layer 142 is filled into the second through holes 134A, 134B and the fork through hole 136. In embodiments, the first dielectric layer 122 is different form the second dielectric layer 142. For example, the first dielectric layer 122 is a multi-layer dielectric structure, such as oxide-nitride-oxide (ONO), oxide-nitride-oxide-nitride-oxide (ONONO) (structures, or a structure construction of tunneling material/trapping material/blocking material for NAND storage material. The second dielectric layer 142 is a single-layer dielectric structure, such as an oxide of single layer. However, the present disclosure is not limited thereto. The different materials also indicate dielectric films of single-layer of different materials, or multi-layer dielectric structures of different film quantities. The dielectric layer may comprise other suitable dielectric materials.

Referring to FIG. 7C, illustrating an enlarged view of an region near four the first through hole 110 in one level of the conductive films 104 of the stack structure. The process for transferring the second through hole 134A removes the conductive connection 118 (FIG. 5A) electrically connecting the conductive strips 116. Therefore, the remained conductive strips 116 after the transferring step are electrically insulated from each other. The transferring process for the second through hole 134B removes a portion of the conductive layer 138 in the first through hole 110 so as to separate the conductive layer 138 into segments separated from each other.

Referring to FIG. 7C, for example, the etching process for the second through hole 1346 is expected to stop on an inner portion of the first dielectric layer 122, such as an inner ONO layer of an ONONO structure. In some conditions, the etching process etches through the ONONO structure. Therefore in embodiments, a dimension D3 (or a width of X direction) of the second through hole 1346 is substantially aligned with or beyond a first sidewall 144 and a second sidewall 146 of the conductive layer 138 in the first through hole 110, or may be beyond the longer sidewall 128 of the first through hole 110.

In some embodiments, patterns of a litho-mask for the second through hole 134A and the second through hole 134B have the same profile, and therefore the second through hole 134A and the second through hole 134B formed by an etching process of low etching selectivity can have the same profile substantially.

Therefore, in one embodiment, sidewalls 148 and 150 of the formed second through hole 134A are aligned with the first sidewall 144 and the second sidewall 146 of the conductive layer 138 respectively, or in a region beyond the first sidewall 144/second sidewall 146 and not reaching the longer sidewall 128 of the first through hole 110. It results in the conductive strip 116 having a second conductive portion 154 wider than a first conductive portion 152, wherein the second conductive portion 154 is formed in a region near the conductive connection 118. In other words, the first conductive portion 152 between the first through holes 110 is a narrower conductive portion, and the second conductive portion 154 between the second through holes 134A is a wider conductive portion, as shown in FIG. 7. In this case, the remained conductive strip 116 remains the curved surface 127, and the thicker corner portion of the first dielectric layer 122 on the curved surface 127 remains on a surface 149 of the second through hole 134A. The first conductive portion 152 and the second conductive portion 154 are arranged alternately along an extending direction of the conductive strip 116.

In another embodiment, the sidewalls 148, 150 of the formed second through hole 134A are aligned with the longer sidewall 128 of the first through hole 110 substantially. It results in the conductive strip 116 having the first conductive portion 152 and the second conductive portion 154 having the same width with the first conductive portion 152 substantially (not shown). In this case, the remained conductive strip 116 remains the curved surface 127, and the thicker corner portion of the first dielectric layer 122 on the curved surface 127 remains on a surface 149 of the second through hole 134A.

In yet another embodiment, the sidewalls 148, 150 of the formed second through hole 134A are beyond the longer sidewall 128 of the first through hole 110. It results in the conductive strip 116 having the first conductive portion 152 narrower than the second conductive portion 154 (not shown). In other words, the first conductive portion 152 is a narrower conductive portion, and the second conductive portion 154 is a wider conductive portion. In this case, the remained conductive strip 116 remains the curved surface 127, and the thicker corner portion of the first dielectric layer 122 on the curved surface 127 remains on a surface 149 of the second through hole 134A.

In one embodiment, second through hole 134A corresponding to the position of the conductive connection 118 also exposes first dielectric layer 122 on a third sidewall 156 adjoined between the first sidewall 144 and the second sidewall 146 of the conductive layer 138, so that the second dielectric layer 142 formed in the second through hole 134A can be adjoined with the exposed first dielectric layer 122 to form a dielectric element continuously extending in Z direction and for defining the conductive strips 116. In other embodiments, the process for the second through hole 134A corresponding to the position of the conductive connection 118 removes a portion or the whole of the thinner portion of the first dielectric layer 122 on the third sidewall 156 of the conductive layer 138, and remains the thinker corner portion of the first dielectric layer 122 on the curved surface 127. In this example, the second dielectric layer 142 filling into the second through hole 134A can still construct the dielectric element with the first dielectric layer 122 to define the conductive strips 116. The removing the portion or the whole of the first dielectric layer 122 on the third sidewall 156 of the conductive layer 138 also results in the first dielectric layer 122 having the thickness T3 on the first sidewall 144 and the second sidewall 146 of the conductive layer 138 and the thickness T2 thinner than the thickness T3 on the third sidewall 156 of the conductive layer 138. For example, as the whole of the first dielectric layer 122 on the third sidewall 156 is removed, the thickness T2 is zero.

The first dielectric layer 122 is not between the second conductive portion 154 and the second dielectric layer 142 in the second through hole 134A. The first dielectric layer 122 is between the first conductive portion 152 and the second dielectric layer 142 in the second through hole 134B, and between the first conductive portion 152 and the conductive layer 138.

In other embodiments, the patterns of a litho-mask for the second through hole 134A and the second through hole 134B may be designed to have different profiles, and an etching process of other kinds of characteristic, such as isotropic, non-isotropic, high etching selectivity, etc, may be used, so as to form the second through hole 134A and the second through hole 134B of desired profiles.

Figure 8A:
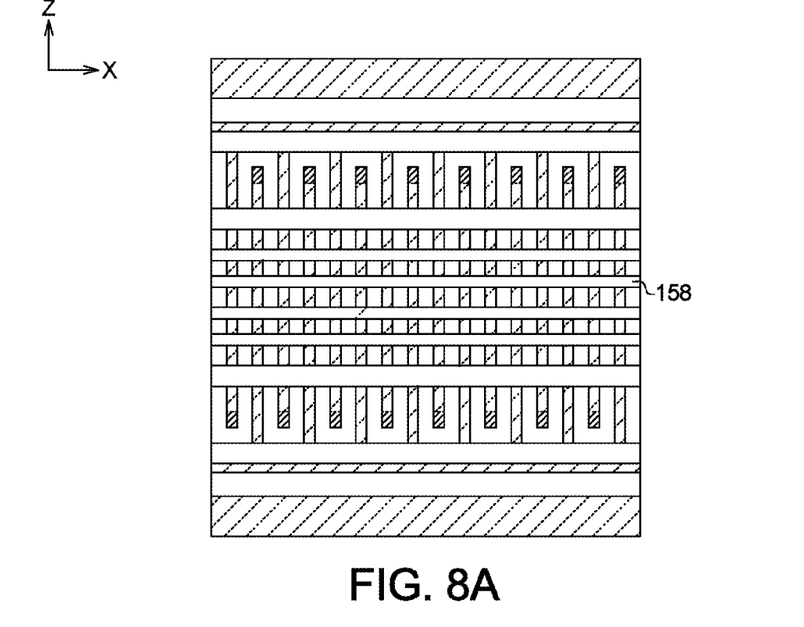

Referring to FIG. 8A, a patterned mask layer 158 such as a photo resist is formed on the structure shown in FIG. 7.

Figure 9A:
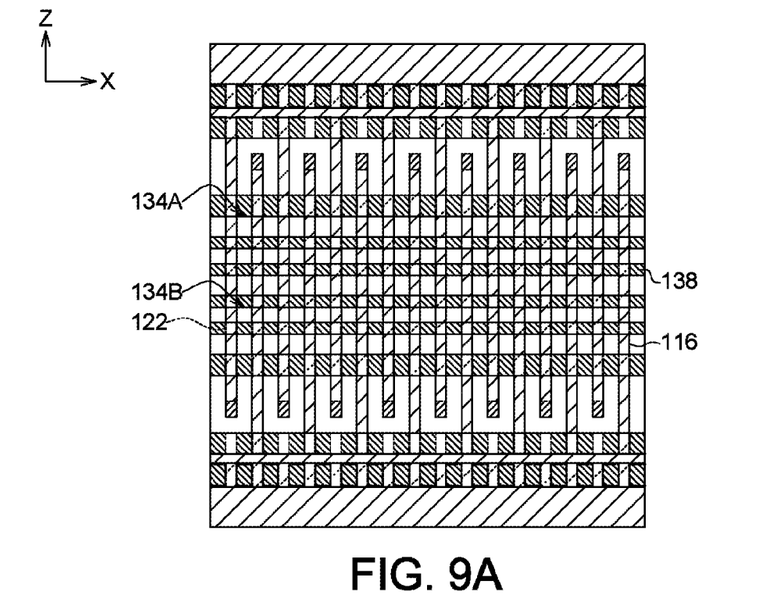
Figure 9B:
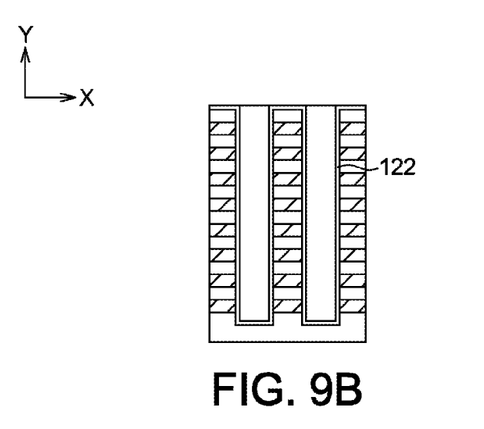
Figure 9C:
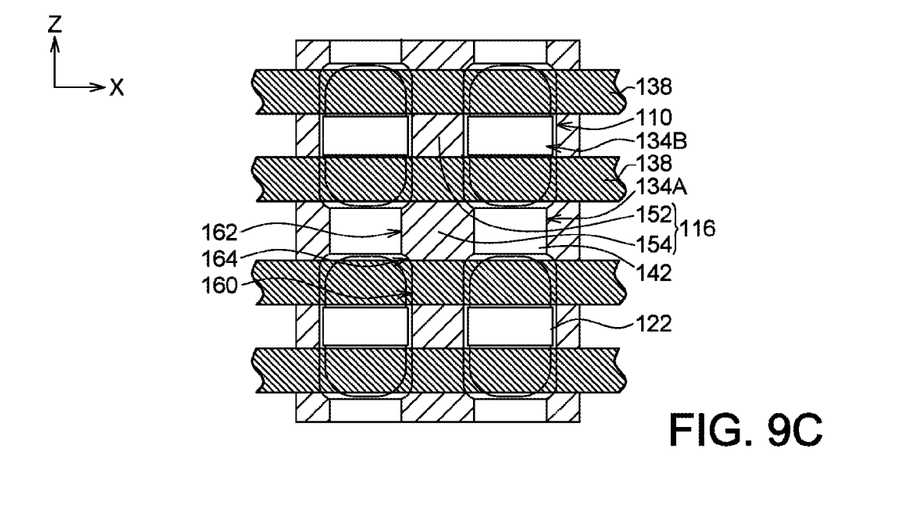

Referring to FIG. 9A to FIG. 9C, a portion of the conductive layer 130 exposed by the mask layer 158 is removed. In embodiments, the etching step removes the strip portion 140 (FIG. 7A) electrically connecting the conductive layers 138, so as to separate and electrically insulating the conductive layers 138. Next, the mask layer 158 is removed.

Referring to FIG. 9C, the first dielectric layer 122 is between or adjoined between the conductive layer 138 and the first conductive portion 152 of the conductive strip 116 crisscrossing the conductive layer 138. Alternatively, the first conductive portion 152 of the conductive strip 116 is adjoined between the first dielectric layers 122. The second dielectric layer 142 is between adjacent two of the conductive layers 138 extending in X direction, and is between or adjoined between adjacent two of the second conductive portions 154 of the conductive strip 116. Alternatively, the second conductive portion 154 of the conductive strip 116 is adjoined between the second dielectric layers 142. The first dielectric layers 122 of different positions in Z direction are separated from each other by the second dielectric layer 142. The first dielectric layer 122 and the second dielectric layer 142 are adjoined with regions of different positions in X direction of the same sidewall of the conductive strip 116 (comprising a sidewall 160, a sidewall 162 and a curved sidewall 164 adjoined between the sidewall 160 and the sidewall 162).

Figure 10A:
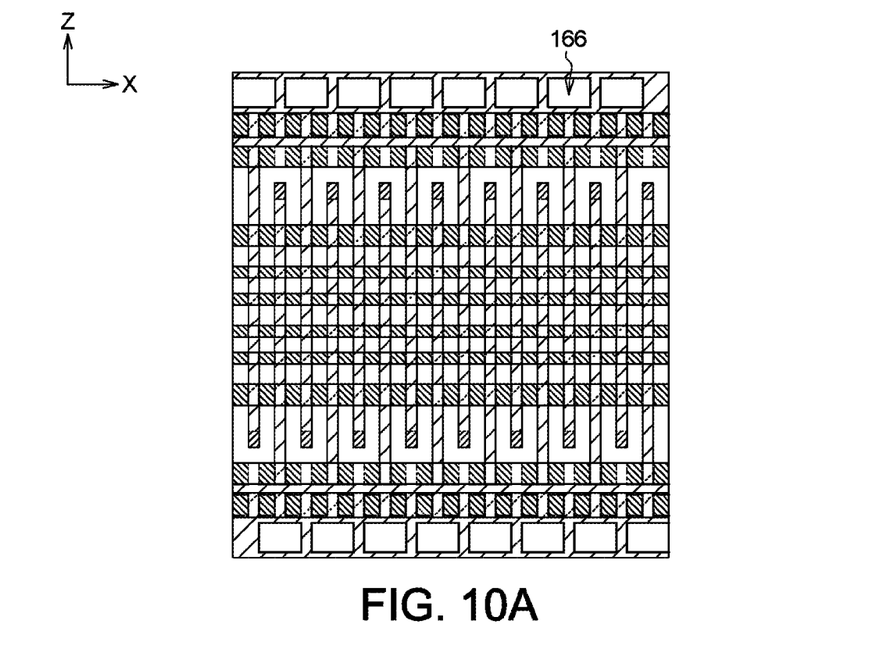
Figure 10B:
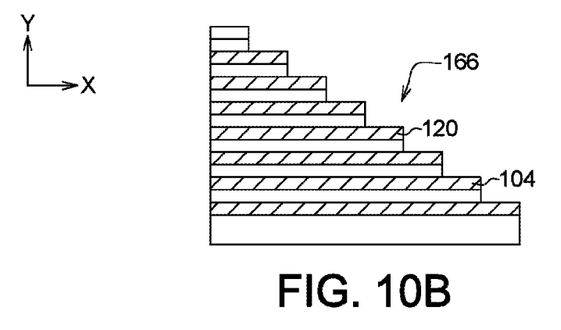

Referring to FIG. 10A and FIG. 10B, openings 166 of different depth are formed in the plate stack by an etching process with a lithograph process, to expose the conductive films 104 (or conductive plates 120) of different levels respectively to form a stair structure.

Figure 11A:
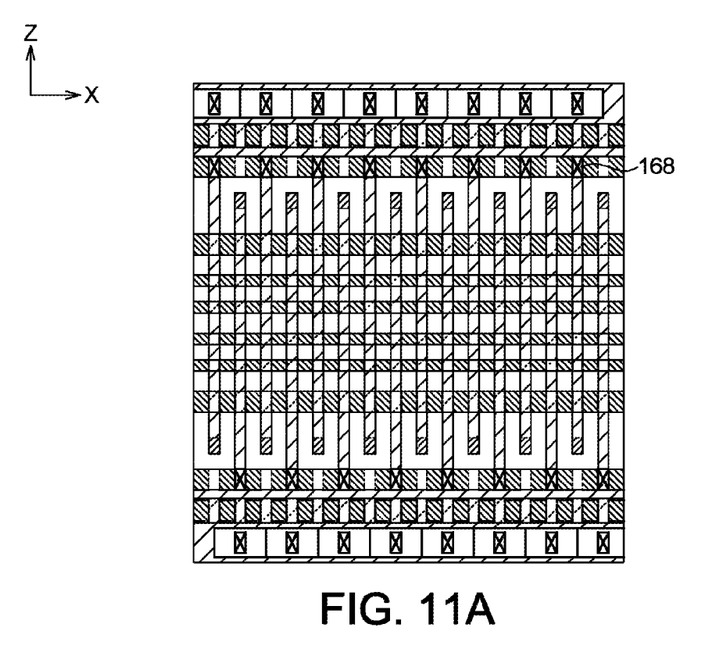

Referring to FIG. 11A, conductive contacts 168 are formed.

In embodiments, the semiconductor structure is a 3D vertical gate memory device. The conductive strip 116 is functioned as a bit line, and the conductive layer 138 is functioned as a word line. A memory cell is defined at a crisscross location between the bit line and the word line. A quantity of the memory cell can be decided according to actual demands and designs, for example by adjusting level numbers of the conductive strip 116 (or bit line) in the stack structure, or adjusting numbers of the conductive strips 116 (or bit line) extending in Z direction and the conductive layer 138 (or word line) extending in X direction of the same level.

Figure 12:
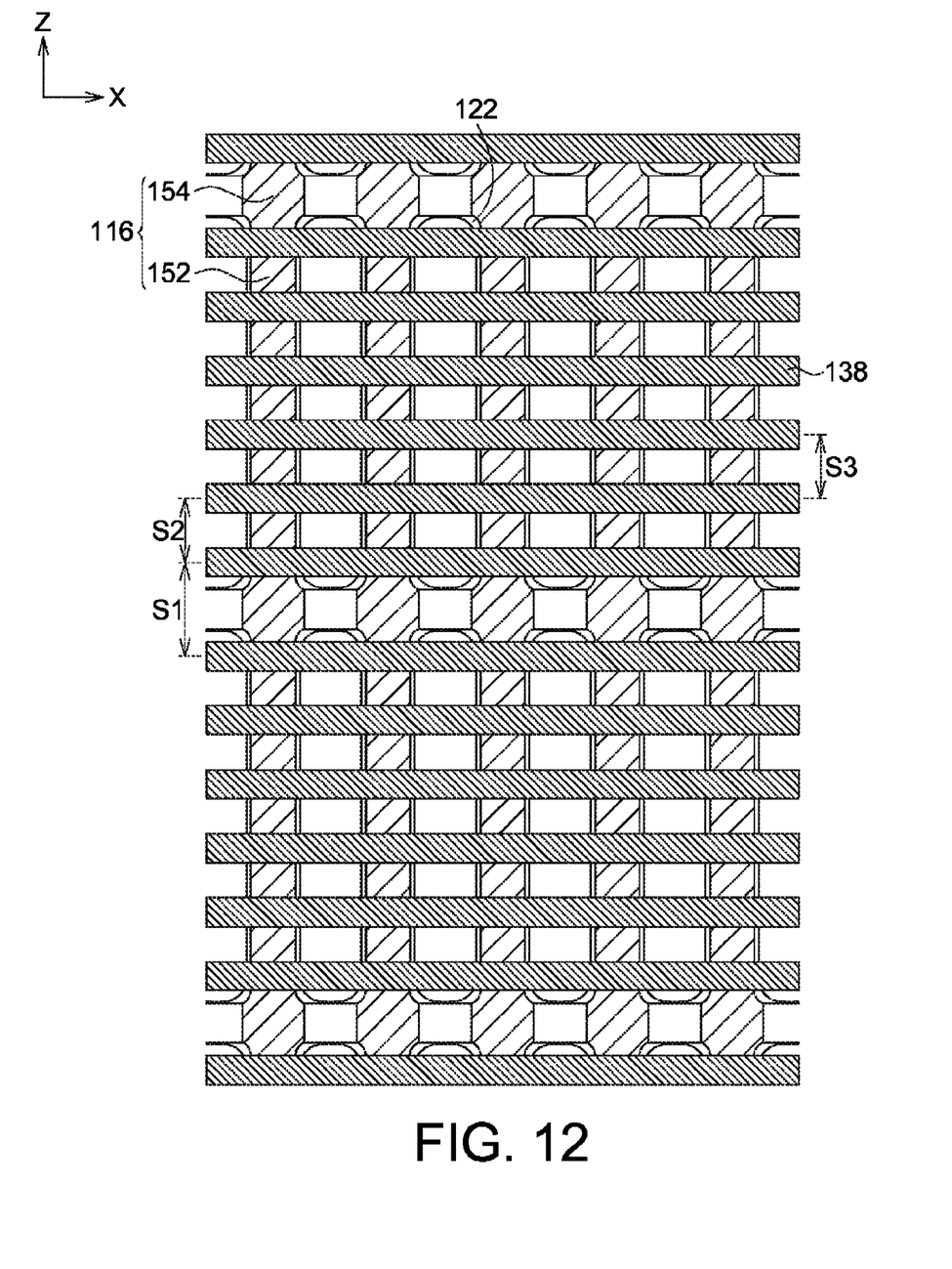
FIG. 12 illustrates a top view of a conductive layer, a conductive strip and a first dielectric layer of a semiconductor structure according to one embodiment.

In the above embodiments, as shown in FIG. 9A, the one second dielectric layer 142 formed in the one first through hole 110 can segment the conductive layer 138 into the two portions extending in X direction. However, the present disclosure is not limited thereto. For example, in the one first through hole 110, the five second dielectric layers 142 in the second through holes 134B may be formed, which results in the six conductive layer 138 defined between the second dielectric layers 142 in the second through holes 134A according to the positions of the conductive connections 118 (or connection stacks), as shown in FIG. 12. There are six the conductive layers 138 between two adjacent of the second conductive portions 154.

In embodiments, the connection stack has a specific D1 (width) in Z direction, which may be restricted by a process limitation or a desired supporting effect from the connection stack. In addition, the process for the second through hole 134A (FIG. 9C) removes the connection stack (or conductive connection 118), or removes the portion of the first dielectric layer 122 adjoined with the connection stack (or conductive connection 118), or even further removes the rounding portion of the conductive layer 138 adjoined with the first dielectric layer 122. Therefore, a dimension in Z direction of the second through hole 134A is bigger than a dimension in Z direction of the second through hole 134B formed by removing the conductive layer 138 in the first through hole 110. It results in a first gap distance S1 (FIG. 12) of adjacent two of the conductive layers 138 (or bit lines) near the second conductive portion 154 and a second gap distance such as a second gap distance S2 or a second gap distance S3 smaller than the first gap distance S1.

In some comparative examples, bit lines are formed by a pattering method in which openings of long strip shape are once defined in the stack structure of the conductive films and the dielectric films. In other words, during the formation process, the whole of sidewalls of the bit lines are exposed to the openings, without being supported by other elements. However, in this condition, bending would easily occur to the bit lines of high aspect ratio due to other stress effect for example resulted from a solution filling in the openings, or dipping-in or pulling-out actions during a dip clean process. The bending damage would result in un-desired short circuit and reduce product yield.

In the embodiments of the present disclosure, the strip stacks comprising the conductive strips 116 are formed by using a multi-patterning method for forming through holes, comprising the first through hole 110 and the second through holes 134A, 134B, with different steps. During the formation process, the material for the conductive strip 116 is supported. For example, after the first through hole 110 is formed, the strip stack is supported by the strip stack and the plate stack. After the second through holes 134A, 134B are formed, the strip stack is supported by the first dielectric layer 122, the second dielectric layer 142 and the conductive layer 138 in the first through hole 110. Therefore, compared to the comparative example, embodiment has a stronger structure characteristic that would not easily have bending problem, and higher reliability.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   conductive strips;
   conductive layers arranged in a crisscross manner with respect to the conductive strips;
   a first dielectric layer between the conductive strips and the conductive layers, wherein the first dielectric layer covers the conductive strips and surrounds the conductive layers; and
   a second dielectric layer different from the first dielectric layer, wherein the second dielectric layer and the first dielectric layer are adjoined with the conductive strips in different positions on a same sidewall of each respective conductive strip, wherein the second dielectric layer is between adjacent two of the conductive strips and between adjacent two of the conductive layers.

2. The semiconductor structure according to claim 1, comprising a plurality of the first dielectric layers separated from each other by the second dielectric layer.

3. The semiconductor structure according to claim 1, wherein the conductive strips have a first conductive portion and a second conductive portion adjoined with the first conductive portion, the first dielectric layer is adjoined with the first conductive portion, the second dielectric layer is adjoined with the second conductive portion, a width of the first conductive portion is different from a width of the second conductive portion.

4. The semiconductor structure according to claim 1, wherein the first dielectric layer and the second dielectric layer are adjoined with different portions of the conductive strips in an extending direction of the conductive strips.

5. The semiconductor structure according to claim 1, wherein the first dielectric layer is a multi-layer dielectric structure, the second dielectric layer is a single-layer dielectric structure.

6. The semiconductor structure according to claim 1, wherein the first dielectric layer is an oxide-nitride-oxide (ONO) or an oxide-nitride-oxide-nitride-oxide (ONONO), the second dielectric layer is an oxide.

7. The semiconductor structure according to claim 1, wherein the semiconductor structure is a memory device, the conductive strips are functioned as bit lines, the conductive layers are functioned as word lines.

8. The semiconductor structure according to claim 7, comprising a plurality of the conductive layers functioned as a plurality of the word lines having a first gap distance and a second gap distance different from the first gap distance between the word lines.

9. A semiconductor structure, comprising:
   a conductive layer;
   a first dielectric layer surrounding the conductive layer;
   a conductive strip crisscrossing the conductive layer, the conductive strip separated from the conductive layer by the first dielectric layer, wherein the conductive strip comprises a first conductive portion, a second conductive portion, and a curved surface between the first conductive portion and the second conductive portion, the first dielectric layer covers the conductive strip; and
   second dielectric layers different from the first dielectric layer, wherein the second conductive portion of the conductive strip is adjoined between the second dielectric layers, wherein the first dielectric layer is a multi-layer dielectric structure, the second dielectric layers are a single-layer dielectric structure.

10. The semiconductor structure according to claim 9, wherein the first dielectric layer is between the first conductive portion of the conductive strip and the conductive layer.

11. The semiconductor structure according to claim 9, wherein the first conductive portion and the second conductive portion are arranged along an extending direction of the conductive strip alternately.

12. The semiconductor structure according to claim 9, comprising a plurality of the first dielectric layers, wherein the first conductive portion of the conductive strip is adjoined between the first dielectric layers.

13. The semiconductor structure according to claim 9, wherein the first dielectric layer is an oxide-nitride-oxide (ONO) or an oxide-nitride-oxide-nitride-oxide (ONONO), the second dielectric layers are an oxide.

14. The semiconductor structure according to claim 9, wherein the semiconductor structure is a memory device, the conductive strip is functioned as a bit line, the conductive layer is functioned as a word line.

15. The semiconductor structure according to claim 14, comprising a plurality of the conductive layers functioned as a plurality of the word lines having a first gap distance and a second gap distance different from the first gap distance between the word lines.

16. A semiconductor structure, comprising:
   a conductive layer comprising a first portion in a first through hole and a second portion above the first portion, wherein the first portion has a first sidewall, a second sidewall opposing to the first sidewall, and a third sidewall between the first sidewall and the second sidewall;
   a conductive strip extending in a direction perpendicular to an extending direction of the second portion of the conductive layer; and
   a first dielectric layer separating the conductive strip and the conductive layer, wherein the conductive layer crisscrosses the conductive strip, wherein the first dielectric layer covers the conductive strip and surrounds the conductive layer, a thickness of a portion of the first dielectric layer on the first sidewall and the second sidewall of the conductive layer is thicker than a thickness of a portion of the first dielectric layer on the third sidewall of the conductive layer.

17. The semiconductor structure according to claim 16, further comprising a second dielectric layer different from the first dielectric layer and adjoined with the first dielectric layer, the first sidewall and the second sidewall of the conductive layer face the first dielectric layer, the third sidewall of the conductive layer faces the second dielectric layer.

\* \* \* \* \*